(12) United States Patent
Pevzner et al.

(10) Patent No.: US 11,606,865 B2
(45) Date of Patent: Mar. 14, 2023

(54) METHOD FOR FORMING CHANNELS IN PRINTED CIRCUIT BOARDS BY STACKING SLOTTED LAYERS

(71) Applicant: RAYTHEON COMPANY, Waltham, MA (US)

(72) Inventors: Mikhail Pevzner, Woburn, MA (US); Gregory G. Beninati, Salem, NH (US); James E. Benedict, Lowell, MA (US); Andrew R. Southworth, Lowell, MA (US)

(73) Assignee: RAYTHEON COMPANY, Waltham, MA (US)

( * ) Notice: Subject to any disclaimer, the term of this patent is extended or adjusted under 35 U.S.C. 154(b) by 473 days.

(21) Appl. No.: 16/678,188

(22) Filed: Nov. 8, 2019

(65) Prior Publication Data

US 2021/0144864 A1    May 13, 2021

(51) Int. Cl.
*H05K 3/46*    (2006.01)
(52) U.S. Cl.
CPC ........... *H05K 3/465* (2013.01); *H05K 3/4679* (2013.01)
(58) Field of Classification Search
CPC .............................. H05K 3/465; H05K 3/4679
USPC ................................ 29/832, 829, 825, 592.1
See application file for complete search history.

(56) References Cited

U.S. PATENT DOCUMENTS

| | | |
|---|---|---|
| 2006/0261536 A1 | 11/2006 | Dangelewicz et al. |
| 2008/0205008 A1 | 8/2008 | Sun et al. |
| 2015/0027640 A1 | 1/2015 | Yasumoto et al. |
| 2015/0104283 A1 | 4/2015 | Nogami et al. |
| 2016/0044798 A1 | 2/2016 | Kawata et al. |
| 2019/0150296 A1* | 5/2019 | Southworth ............ H01P 1/047 361/807 |

(Continued)

FOREIGN PATENT DOCUMENTS

| | | |
|---|---|---|
| CN | 103945649 A | 7/2014 |
| JP | 2009013313 A | 1/2009 |
| JP | 2016215532 A | 12/2016 |

(Continued)

OTHER PUBLICATIONS

International Search Report and Written Opinion in International Patent Application No. PCT/US2020/058538 dated Feb. 17, 2021.

(Continued)

*Primary Examiner* — Peter Dungba Vo
*Assistant Examiner* — Azm A Parvez
(74) *Attorney, Agent, or Firm* — Lando & Anastasi, LLP

(57) ABSTRACT

A process of fabricating an electromagnetic circuit includes providing three laminate sheets, forming a first feature in a first laminate sheet of the three laminate sheets, and forming a second feature in a second laminate sheet of the three laminate sheets. The second feature is aligned with the first feature when aligning the second laminate sheet with the first laminate sheet. The process further includes stacking the three laminate sheets so that the first laminate sheet is positioned above and aligned with the second laminate sheet and the second laminate sheet is positioned above and aligned with the third laminate sheet. The first feature and the second feature define a contiguous element. The process further includes filling the contiguous element with an electrically conductive material to form an electrically continuous conductor.

8 Claims, 5 Drawing Sheets

(56) References Cited

U.S. PATENT DOCUMENTS

2019/0269021 A1* 8/2019 Nufio-Molina ........ H01C 7/006

FOREIGN PATENT DOCUMENTS

JP      2019160973 A    9/2019
WO   2014127377 A1   8/2014

OTHER PUBLICATIONS

International Search Report and Written Opinion in International Patent Application No. PCT/US2020/058540 dated Feb. 15, 2021.
Kiswanto et al., "Development of Robotic Arm Manipulator Control System for Micromilling Tool Wear Monitoring Based on Computer Vision," 2021 7th International Conference on Mechatronics and Robotics Engineering (ICMRE), 2021, pp. 69-76. (Year: 2021).

* cited by examiner

METHOD FOR FORMING CHANNELS IN PRINTED CIRCUIT BOARDS BY STACKING SLOTTED LAYERS

RELATED APPLICATION

This application relates to U.S. patent application Ser. No. 16/678,211, titled "PRINTED CIRCUIT BOARD AUTOMATED LAYUP SYSTEM", by Mikhail Pevzner, James E. Benedict, Andrew R. Southworth and Wade A. Schwanda, filed on Nov. 8, 2019, which is incorporated herein by reference in their entirety for all purposes.

GOVERNMENT RIGHTS

Not applicable.

BACKGROUND

Radio frequency (RF) and electromagnetic circuits may be manufactured using conventional printed circuit board (PCB) processes. Conventional PCB manufacturing processes may include lamination, electroplating, masking, etching, and other complex process steps, and may require multiple steps, expensive and/or hazardous materials, multiple iterations, extensive labor, etc., all leading to higher cost and slower turnaround time. Additionally, conventional PCB manufacturing processes have limited ability to allow for small feature sizes, such as signal trace (e.g., stripline) dimensions, and dimensions of dielectric materials between conductors (e.g., dielectric thickness, inter-via spacing, etc.), thereby limiting the range of highest frequency signals that may be supported by such circuits.

Signal conductors (e.g., signal traces, strip lines, interlayer "vertical" feeds) and reference surfaces and conductors (e.g., ground planes, Faraday boundaries or "walls") within various circuits are suitable for various circuit board manufacturing, including radio frequency circuit embodiments. Additive and subtractive manufacturing techniques provide structures for conveyance and containment of various signals, and particularly of radio frequency signals in microwave and millimeter wave ranges, e.g., up to 300 GHz or more.

In some known processes, a Faraday wall, a copper vertical launch (CVL) interconnect or an embedded component may be formed on a dielectric substrate by machining away (e.g., milling) a portion of cladding (e.g., electroplate copper) and dielectric substrate. FIGS. 1A and 1B illustrate such a machining process. The laminated structure shown in FIG. 1A is machined, e.g., milled, to create channels or trenches to access copper surfaces. The channel or trench can take the form of a cavity. Once the channel is created, the channel is filed with a conductor, such as a conductive ink applied using printing techniques, to form an electromagnetic boundary. Such an electromagnetic boundary may enforce boundary conditions of an electromagnetic signal, e.g., to control or limit modes of a signal and/or characteristic impedance, or may provide isolation to confine signals to a region of an electromagnetic circuit, e.g., a Faraday boundary to prevent a signal at one region of the circuit from affecting another region of the circuit, e.g., shielding. In other embodiments, the channel is filled with wire or the cavity is embedded with a component.

SUMMARY

One aspect of the present disclosure is directed to a process of fabricating an electromagnetic circuit. In one embodiment, the process comprises: providing three laminate sheets, each laminate sheet including a flat sheet of dielectric material having a layer of copper applied to the sheet, the copper layer being formed into conductive lines and traces, including pads and vias; forming at least one first feature in a first laminate sheet of the three laminate sheets; forming at least one second feature in a second laminate sheet of the three laminate sheets, the at least one second feature being aligned with the first feature when aligning the second laminate sheet with the first laminate sheet; stacking the three laminate sheets so that the first laminate sheet is positioned above and aligned with the second laminate sheet and the second laminate sheet is positioned above and aligned with the third laminate sheet, the at least one first feature and the at least one second feature defining a contiguous element; and filling the contiguous element with an electrically conductive material to form an electrically continuous conductor.

Embodiments of the process further may include the at least one first feature being a slot or channel and the at least one second feature being a slot channel. The contiguous element created by the at least one first feature and the at least one second feature together may create a channel. The electrically continuous conductor may create a Faraday wall. The third laminate sheet may be formed with a solid copper layer to create a ground plane, with the electrically continuous conductor being in contact with the ground plane. The at least one first feature may be an opening and the at least one second feature may be an opening. The contiguous element created by the at least one first feature and the at least one second feature together may create an elongate opening. The elongate opening may form a conductive interconnection. The third laminate sheet may include a conductive trace in communication with the contiguous element. The copper layer can be etched or milled to form a desired electrical pattern. The laminate sheets may be stacked with respect to one another manually with the aid of an alignment fixture having pins. The process further may include, after stacking the laminate sheets, curing the laminate sheets under pressure and temperature to form an integral final product having a uniform thickness. Filling the channel with an electrically conductive material may include printing of conductive ink into the channel. The process further may include disposing a fourth laminate sheet over the first laminate sheet.

Another aspect of the disclosure is directed to a process comprising: providing three laminate sheets, each laminate sheet including a flat sheet of dielectric material having a layer of copper applied to the sheet, the copper layer being formed into conductive lines and traces, including pads and vias; forming at least one first feature in a first laminate sheet of the three laminate sheets; forming at least one second feature in a second laminate sheet of the three laminate sheets, the at least one second feature being aligned with the first feature when aligning the second laminate sheet with the first laminate sheet; stacking the three laminate sheets so that the first laminate sheet is positioned above and aligned with the second laminate sheet and the second laminate sheet is positioned above and aligned with the third laminate sheet, the at least one first feature and the at least one second feature defining a cavity; and securing an embedded component on a pad within the cavity.

Embodiments of the process further may include the at least one first feature being an opening and the at least one second feature being an opening. The contiguous element created by the at least one first feature and the at least one second feature together may create the cavity. The laminate sheets may be are stacked with respect to one another manually with the aid of an alignment fixture having pins. The process further may include, after stacking the laminate sheets, curing the laminate sheets under pressure and temperature to form an integral final product having a uniform thickness. The process further may include disposing a fourth laminate sheet over the first laminate sheet.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the disclosure. In the figures, each identical or nearly identical component that is illustrated in various figures may be represented by a like numeral. For purposes of clarity, not every component may be labeled in every figure. In the figures.

DETAILED DESCRIPTION

Figure 1A:
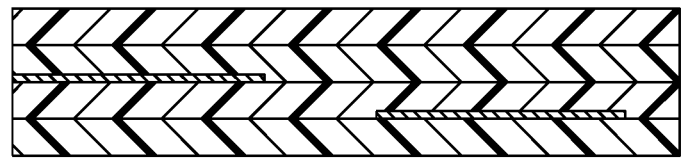
FIG. 1A is a cross-sectional view of a laminated structure.
Figure 1B:
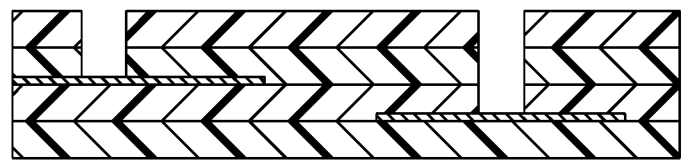
FIG. 1B is a cross-sectional view of the laminated structure shown in FIG. 1A with channels machined therein.

Manufacturing processes described herein may be particularly suitable for fabrication of such circuit structures having small circuit features capable of supporting electromagnetic signals in the range of 8 to 75 GHz or more, for example, and up to 300 GHz or more. Electromagnetic circuit structures in accord with methods described herein may be particularly suitable for application in 28 to 70 GHz systems, including millimeter wave communications, sensing, ranging, etc. Aspects and embodiments described may also be suitable for lower frequency ranges, such as in the S-band (2-4 GHz), X-band (8-12 GHz), or others.

The processes described herein may support smaller arrangements and dimensions than conventional processes are capable. Such conventional circuit boards may be limited to frequencies below about 30 GHz. The processes described herein may allow or accommodate the manufacture of electromagnetic circuits of smaller dimensions, suitable for radio frequency circuits intended to be operated at higher frequencies, using safer and less complex manufacturing, and at lower cost.

Electromagnetic circuits and processes of manufacture in accord with those described herein include laminating techniques to produce electromagnetic circuits and components capable of handling higher frequencies, with lower profiles, and at reduced costs, cycle times, and design risks, than conventional circuits and processes. Examples of techniques include laminating sheets of standard printed circuit board (PCB) laminates, i.e., dielectric material having copper traces, on one another to create slots or channels that represent a cross-section of a slot or channel in the layers. As used herein, channels refer to slots, trenches and other cavities configured to receive conductive materials. Once created, printing techniques, such as three-dimensional (3-D) printing, can be employed to deposit printed conductive inks into a channel or trench to form a continuous electric barrier, e.g., a Faraday wall. In other embodiments, components can be embedded into the channels, including cavities.

Any of the above example techniques and/or others may be combined to make various electromagnetic components and/or circuits. Aspects and examples of such techniques are described and illustrated herein with respect to a radio frequency interconnect to contain and convey an electromagnetic signal along a layer of an electromagnetic circuit in one dimension and vertically through to other layers of the circuit in another dimension. The techniques described herein may be used to form various electromagnetic components, connectors, circuits, assemblies, and systems.

Advanced manufacturing technology (AMT) approach for fabricating radio frequency (RF) boards requires creation of channels in the boards that later get filled with conductive material. As described above, these features are sometimes referred to as Faraday walls. In order to achieve a desired design objective, channels have to be formed very accurately, such that they reach specified PCB copper layers. Since the copper thicknesses are very small, achieving the required tolerances can be challenging and time-intensive. These challenges oftentimes result in slow process and/or low production rates rate due to incremental cutting and inspection, and/or penetration of the copper layer results in reduced conductor contact causing depending on applications, reduced performance or scrap.

Embodiments of the present disclosure describe a process in which the individual layers of laminate sheets are slotted and then laminated to one another, thus ensuring that the formed channels are the exact depth. Since the slots are formed prior to lamination, the slots reach the conductive layer and thus cannot cut through the conductive layer. This process eliminates the need for accurate depth milling of individual layers so that each layer can be machined all the way through without having to be concerned about tolerances surrounding depths of machining. It is an additive manufacturing approach to create channels in PCBs and to create complex shapes with precut layers of material.

It is to be appreciated that embodiments of the processes discussed herein are not limited in application to the details of construction and the arrangement of components set forth in the following description or illustrated in the accompanying drawings. The processes are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, end, side, vertical and horizontal, and the like, are intended for convenience of description, not to limit the present systems and processes or their components to any one positional or spatial orientation.

The term "radio frequency" as used herein is not intended to be limited to a particular frequency, range of frequencies, band, spectrum, etc., unless explicitly stated and/or specifically indicated by context. Similarly, the terms "radio frequency signal" and "electromagnetic signal" are used interchangeably and may refer to a signal of various suitable frequency for the propagation of information-carrying signals for any particular implementation. Such radio frequency signals may generally be bound at the low end by frequencies in the kilohertz (kHz) range, and bound at the high end by frequencies of up to hundreds of gigahertz (GHz), and explicitly includes signals in the microwave or millimeter wave ranges. Generally, processes in accord with those described herein may be suitable for handling non-ionizing radiation at frequencies below those conventionally handled in the field of optics, e.g., of lower frequency than, e.g., infrared signals.

Various embodiments of radio frequency circuits may be designed with dimensions selected and/or nominally manufactured to operate at various frequencies. The selection of appropriate dimensions may be had from general electromagnetic principles and are not presented in detail herein.

Figure 2A:
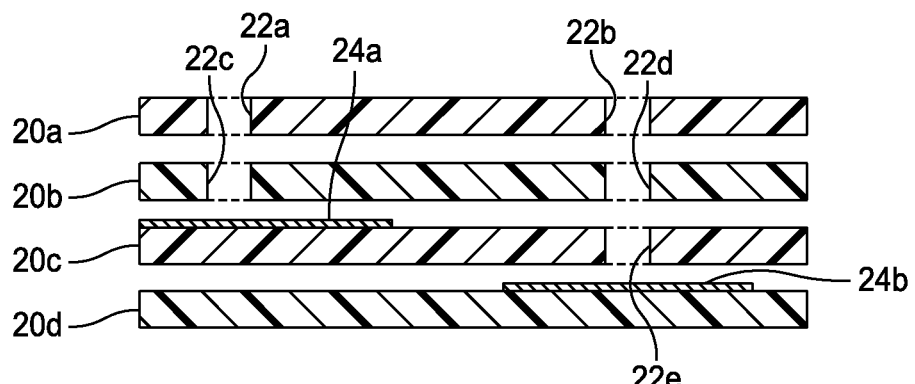
FIG. 2A is a cross-sectional exploded view of laminate sheets used to create a laminated structure.
Figure 2B:
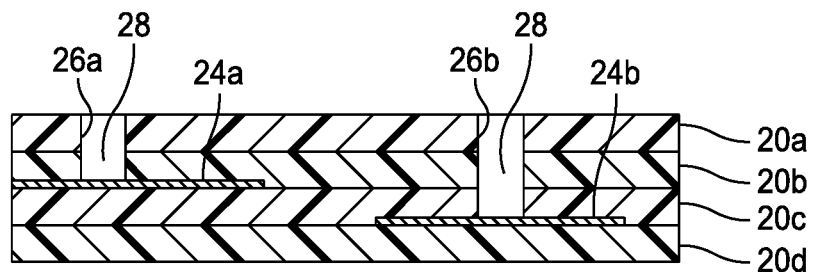
FIG. 2B is a cross-sectional view of the assembled laminated structure shown in FIG. 2A.

Referring to the drawings, and more particularly FIGS. 2A and 2B, several laminate sheets, indicated 20a, 20b, 20c, 20d, are shown separated from one another. As known, a PCB, also referred to as a printed wiring board (PWB), includes a flat sheet of dielectric material having a layer of copper applied to the sheet. The copper layer is formed into conductive lines and traces, including pads by chemical etching or other appropriate processes. A PCB can be configured to include multiple layers having multiple laminate sheets, with bond films being provided between the laminate sheets to secure the laminate sheets to one another during curing. The bond films are not shown for the purpose of clarity. However, the bond films can be manipulated and formed in the same or similar manner as the laminate sheets. As shown in FIG. 2A, the laminate sheets 20a-20d are configured to create a channel or slot once laminated. For example, laminate sheet 20a includes two slots 22a, 22b formed therein. Laminate sheet 20b includes two slots 22c, 22d formed therein, which are aligned with slots 22a, 22b of laminate sheet 20a, respectively. Laminate sheet 20c includes a single slot 22e formed therein, which is aligned with slot 22d of laminate sheet 20b and slot 22b of laminate sheet 20a. In one embodiment, the slots 22a-22e are formed by a machining process, e.g., milling. Other processes can be employed to create slots 22a-22e.

Laminate sheet 20c further includes a conductive trace 24a formed on a top surface of the laminate sheet, the conductive trace 24a being positioned under slots 22c, 22a of laminate sheets 20b, 20a, respectively. Laminate sheet 20d includes a conductive trace 24b formed on a top surface of the laminate sheet, the conductive trace 24b being positioned under slots 22e, 22d, 22b of laminate sheets 20c, 20b, 20a, respectively, when stacked on top of each other. As mentioned above, the conductive traces 24a, 24b can be achieved by chemical etching. Other features can be provided but are not illustrated to more clearly show the processes described herein.

As shown in FIG. 2B, when the laminate sheets 20a-20d are assembled with one another, they collectively create a multilayer PCB having a first slot 26a and a second slot 26b formed therein. The slots 26a, 26b are created at an exact depth to expose the conductive traces 24a, 24b. The laminate sheets 20a-20d are stacked in an order of assembly. In one known process, the laminate sheets are cured under pressure and temperature to form an integral final product having a uniform thickness. Any suitable lamination process known in the art can be employed. The flat sheet of dielectric material for each laminate sheet 20a-20d can be fabricated from varying weaves, thickness and resin percentage to achieve a final thickness and dielectric characteristics.

Once assembled, the slots 26a, 26b are filled with conductive material 28 by a suitable process, such as printing of conductive material, e.g., conductive ink. Other depositing methods can be employed, such as inserting conductive material, e.g., copper wire, within the slots 26a, 26b. The laminated product can be subject to other PCB processes to create a finished product.

Figure 3:
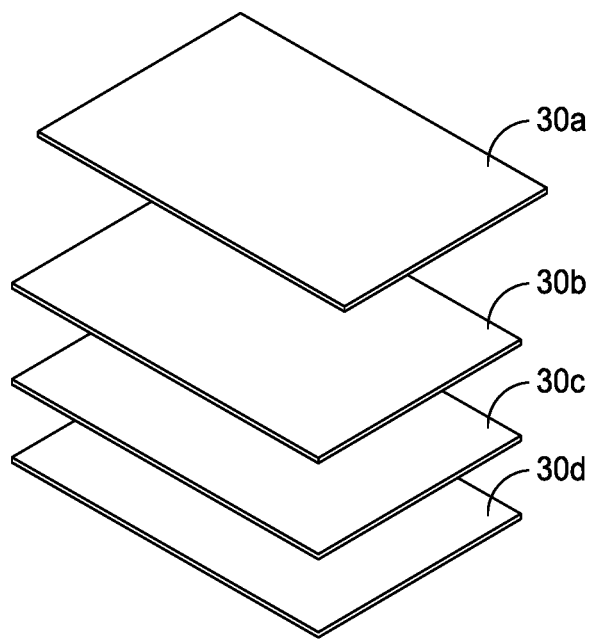
FIG. 3 is an exploded perspective view of laminate sheets.

Referring to FIGS. 3-9, a process of assembling a PCB is shown and described. FIG. 3 illustrates several laminate sheets, indicated 30a, 30b, 30c, 30d, that are separated from one another. Each laminate sheet 30a-30d may be fabricated from a flat sheet of dielectric material having a layer of copper applied to the sheet. Any suitable dielectric material can be selected. The copper layer can be etched or milled to form a desired electrical pattern. Although four laminate sheets 30a-30d are shown, any number of laminate sheets can be provided.

Figure 4:
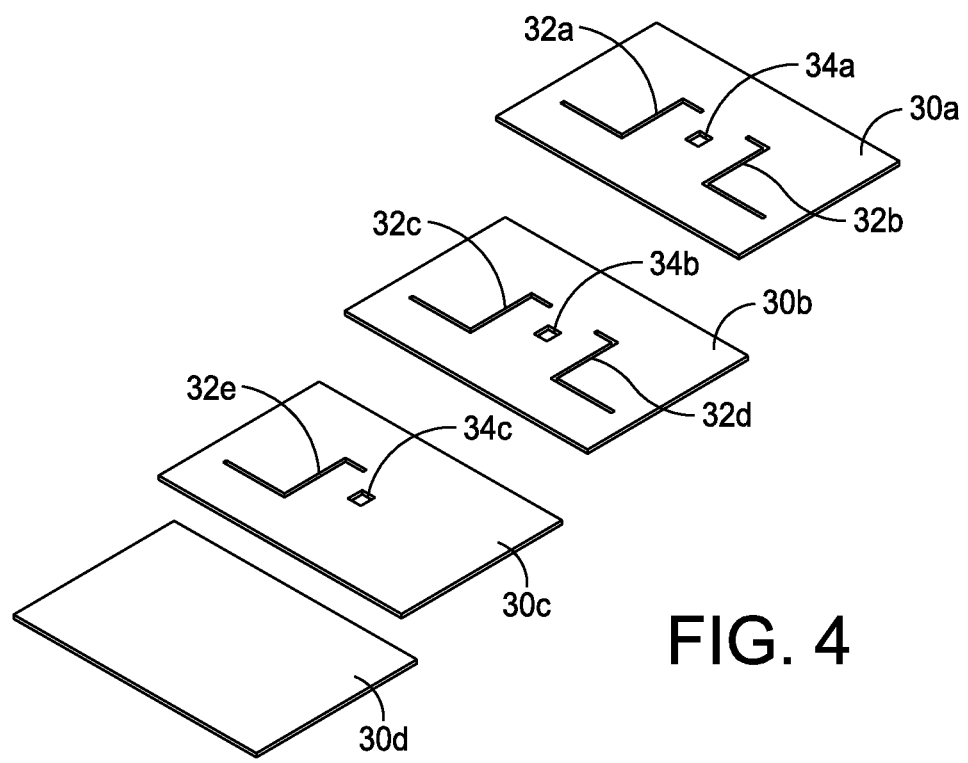
FIG. 4 is an exploded perspective view of the laminate sheets shown in FIG. 3 having features machined therein.

In FIG. 4, each laminate sheet 30a-30d has material removed to form slots or channels in the laminate sheet. As shown, laminate sheet 30a includes slots 32a, 32b and an opening 34a. Laminate sheet 30b includes slots 32c, 32d and an opening 34b. Laminate sheet 30c includes slot 32e and an opening 34c. Laminate sheet 34d is unaffected, but may include other types of features. The shapes and sizes of the slots 32a-32e are for illustration principles only and can be configured in any desirable manner. The openings 34a, 34b, 34c are located centrally in the laminate sheets 30a, 30b, 30c, but can be located anywhere on the laminate sheets. In one embodiment, the openings 34a, 34b, 34c can form a via or some other conductive feature.

Figure 5:
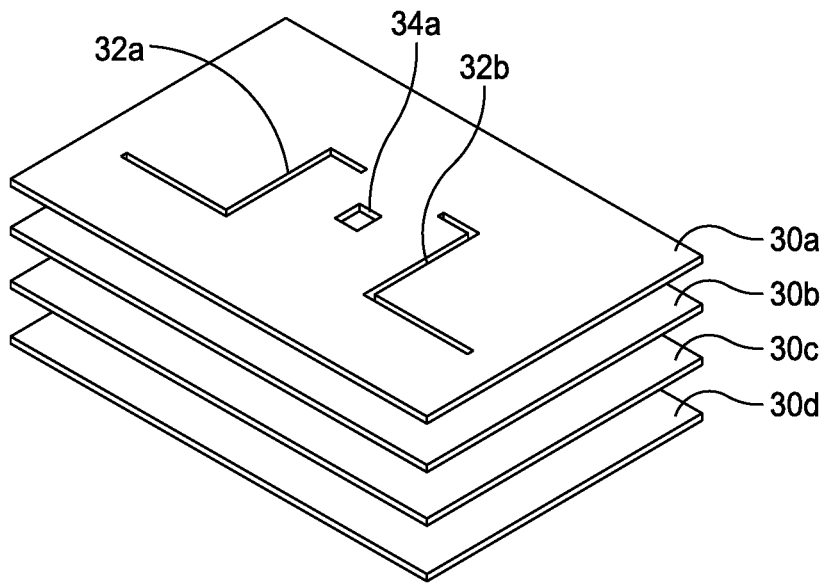
FIG. 5 is an exploded perspective view of the laminate sheets shown in FIG. 4 in stacked relation.
Figure 6:
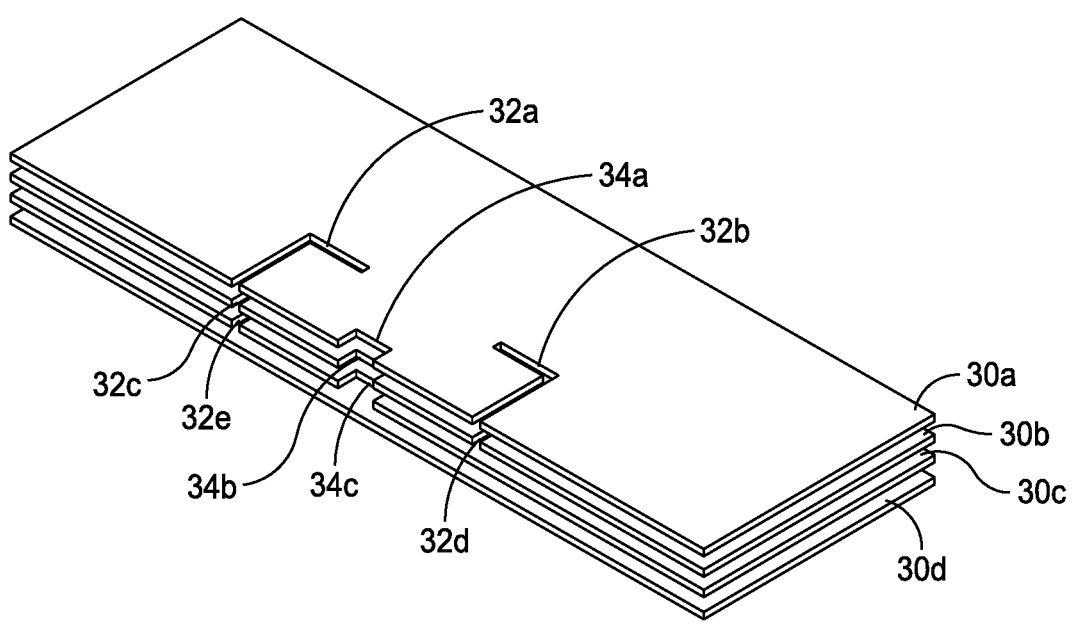
FIG. 6 is a cross-sectional perspective view of the laminate sheets shown in FIG. 5.
Figure 7:
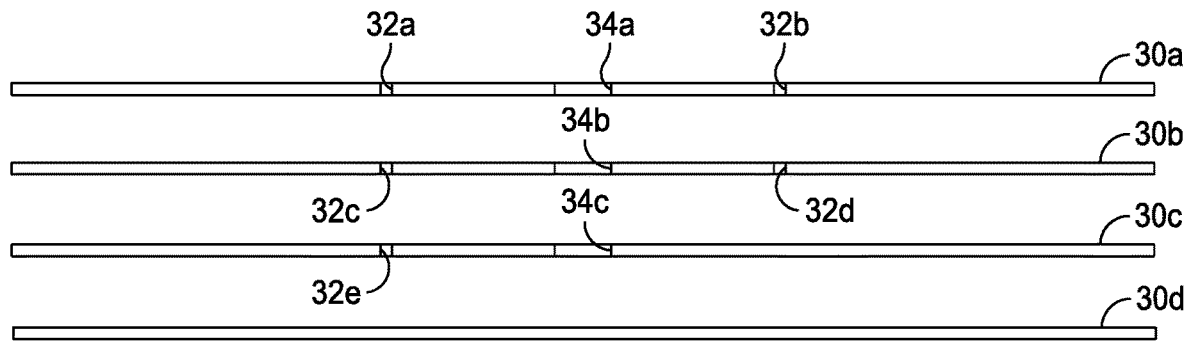
FIG. 7 is a cross-sectional side view of the laminate sheets shown in FIG. 5.

In FIG. 5, the laminate sheets 30a-30d are stacked with respect to one another. The arrangement is such that slots 32a, 32c, 32e of laminate sheets 30a, 30b, 30c, respectively, and the slots 32b, 32d of laminate sheets 30a, 30b, and the openings 34a, 34b, 34c of laminate sheets 30a, 30b, 30c, respectively, are aligned with one another. Laminate sheet 30d is placed under laminate sheet 30c. The laminate sheets 30a-30d can be stacked with respect to one another manually with the aid of an alignment fixture having pins or other features to align the laminate sheets. In another embodiment, the laminate sheets 30a-30d can be stacked with respect to one another through an automated process. FIGS. 6 and 7 illustrate the alignment of slots 32a, 32c, 32e, the alignment of slots 32b, 32d, and the alignment of openings 34a, 34b, 34c.

Figure 8:
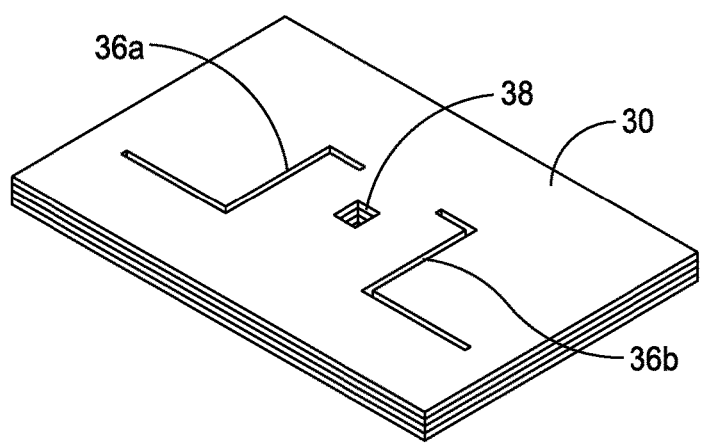
FIG. 8 is a perspective view of the assembled laminated structure created by the laminate sheets.

In FIG. 8, the laminate sheets 30a-30d are assembled with one another to collectively create a multilayer PCB, indicated at 30, having a first slot 36a and a second slot 36b formed therein. The slots 36a, 36b are created at an exact depth to expose the conductive traces (not shown) provided on laminate sheets 30c, 30d. The PCB 30 further includes an opening 38, which can be form a via or some other conductive feature. The laminate sheets 30a-30d are stacked in an order of assembly. As described above, the laminate sheets 30a-30d are cured under pressure and temperature to form an integral final product having a uniform thickness.

Figure 9:
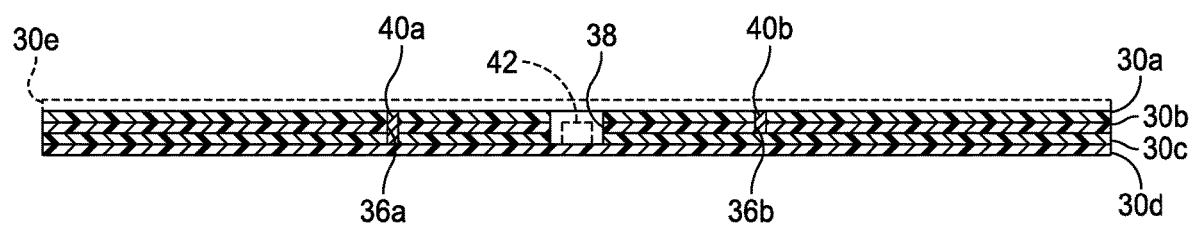
FIG. 9 is a cross-sectional view of the assembled laminated structure.

In FIG. 9, once assembled, the slots 36a, 36b can be filled with conductive material 40a, 40b, respectively, which, as described herein, can be conductive ink. The resulting structure can be a Faraday wall. The opening 38 can likewise be coated with conductive material, such as copper. The resulting structure can be a via.

Thus, a PCB can be configured to include multiple layers having multiple laminate sheets. The laminate sheets 30a-30d are configured to create a channel or trench once laminated. Once created, printing techniques can be employed to deposit printed conductive inks into the channel to form a continuous electric barrier, e.g., a Faraday wall.

In some embodiments, the bottom laminate sheet 30d can be formed with a solid copper layer to create a ground plane, with the conductive ink provided in filled channel being in contact with the ground plane. The result is that the Faraday wall created by the filled channel and the ground plane together form a substantially electrically continuous conductor that provides a boundary for signal(s) conveyed by a signal trace. In some embodiments, dimensional placement of the Faraday wall and the ground plane may be selected to control or limit a propagating mode of a signal conveyed by the signal trace and/or to establish a characteristic impedance for signal(s) conveyed by the signal trace. In certain embodiments, the Faraday wall and the ground plane may be positioned such that only a transverse electromagnetic (TEM) signal mode may propagate along the signal trace. In other embodiments, the Faraday wall may be positioned to isolate one portion of a circuit from another portion of a circuit without enforcing a particular propagating mode and/or without contributing to an impedance for any particular signal(s).

In some embodiments, the resulting circuit board structure is merely an example and portion of a structure in which an electromagnetic circuit may be provided. Further extent of the substrates shown may accommodate various circuit components, and additional substrates having additional layers to accommodate additional circuit components may be provided in various embodiments. Typically, a portion of a circuit may be disposed on a particular layer, and may include ground planes above and/or below, and other portions of a total circuit (or system) may exist at different regions of the same layer or on other layers.

In some embodiments, the methods disclosed herein can be employed to create complex-shaped channels, and are not limited to orthogonal channels. For example, a complex, non-uniform profile can be created in the laminate sheets of the circuit board across several dimensions of the circuit board. For example, the openings, such as openings 34a, 34b, 34c, can be used for housing embedded components, with laminate sheets being disposed over the embedded components. FIG. 9 illustrates laminate sheet 34e disposed over the opening 38 to embed components mounted within the opening, such as component 42, which is secured to a pad, for example.

Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the disclosure. Accordingly, the foregoing description and drawings are by way of example only.

What is claimed is:

1. A process of fabricating an electromagnetic circuit, the process comprising:
    providing three laminate sheets, each laminate sheet including a flat sheet of dielectric material having a layer of copper applied to the sheet, the copper layer being formed into conductive lines and traces, including pads and vias;
    forming at least one first feature in a first laminate sheet of the three laminate sheets, the at least one first feature being a slot or channel;
    forming at least one second feature in a second laminate sheet of the three laminate sheets, the at least one second feature being a slot or channel, the at least one second feature being aligned with the first feature when aligning the second laminate sheet with the first laminate sheet;
    after forming the at least one first feature in the first laminate sheet and the at least one second feature in the second laminate sheet, stacking the three laminate sheets so that the first laminate sheet is positioned above and aligned with the second laminate sheet and the second laminate sheet is positioned above and aligned with a third laminate sheet, the at least one first feature and the at least one second feature defining a contiguous element; and
    after stacking the three laminate sheets, filling the contiguous element with an electrically conductive material to form an electrically continuous conductor, the electrically continuous conductor creating a Faraday wall.

2. The process of claim 1, wherein the third laminate sheet is formed with a solid copper layer to create a ground plane, with the electrically continuous conductor being in contact with the ground plane.

3. The process of claim 1, wherein the third laminate sheet includes a conductive trace in communication with the contiguous element.

4. The process of claim 1, wherein the copper layer is etched or milled to form a desired electrical pattern.

5. The process of claim 1, wherein the laminate sheets are stacked with respect to one another manually with the aid of an alignment fixture having pins.

6. The process of claim 1, further comprising, after stacking the laminate sheets, curing the laminate sheets under pressure and temperature to form an integral final product having a uniform thickness.

7. The process of claim 1, wherein filling a channel with an electrically conductive material includes deposition of conductive ink into the channel.

8. The process of claim 1, further comprising disposing a fourth laminate sheet over the first laminate sheet.

* * * * *